United States Patent
Hung et al.

(10) Patent No.: US 7,855,889 B2
(45) Date of Patent: Dec. 21, 2010

(54) RESILIENT FASTENER AND THERMAL MODULE INCORPORATING THE SAME

(75) Inventors: Jui-Wen Hung, Taipei Hsien (TW); Shang-Chih Liang, Taipei Hsien (TW)

(73) Assignee: Foxconn Technology Co., Ltd., Tucheng, Taipei County (TW)

( * ) Notice: Subject to any disclaimer, the term of this patent is extended or adjusted under 35 U.S.C. 154(b) by 918 days.

(21) Appl. No.: 11/735,806

(22) Filed: Apr. 16, 2007

(65) Prior Publication Data

US 2008/0202740 A1    Aug. 28, 2008

(30) Foreign Application Priority Data

Feb. 9, 2007    (CN) .................. 2007 1 0073256

(51) Int. Cl.
    *H05K 7/20* (2006.01)
    *F28F 7/00* (2006.01)
    *F28D 15/00* (2006.01)
    *H01L 23/34* (2006.01)

(52) U.S. Cl. .................. 361/700; 165/104.33; 165/185; 257/719; 361/694; 361/695; 361/719

(58) Field of Classification Search .................. 257/719; 361/700
    See application file for complete search history.

(56) References Cited

U.S. PATENT DOCUMENTS

| | | | | |
|---|---|---|---|---|
| 5,548,482 A | * | 8/1996 | Hatauchi et al. ............ | 361/720 |
| 6,266,245 B1 | * | 7/2001 | Wei ............................. | 361/704 |
| 6,462,952 B1 | * | 10/2002 | Ubukata et al. ............. | 361/719 |
| 6,883,594 B2 | * | 4/2005 | Sarraf et al. ........... | 165/104.33 |
| 7,019,976 B1 | * | 3/2006 | Ahmad et al. ............... | 361/704 |
| 7,319,976 B1 | * | 1/2008 | Peckover ................. | 705/14.36 |
| 7,333,340 B2 | * | 2/2008 | Zhang et al. ................ | 361/719 |
| 7,447,035 B2 | * | 11/2008 | Liu et al. .................... | 361/719 |
| 7,697,288 B2 | * | 4/2010 | Okutsu ....................... | 361/695 |
| 2004/0188079 A1 | | 9/2004 | Chiou et al. | |
| 2005/0201061 A1 | | 9/2005 | Nikfar | |
| 2006/0181850 A1 | * | 8/2006 | Frank et al. ................. | 361/700 |
| 2007/0274049 A1 | * | 11/2007 | Lin et al. .................... | 361/704 |

FOREIGN PATENT DOCUMENTS

CN    2817070 Y    9/2006

* cited by examiner

*Primary Examiner*—Gregory D Thompson
(74) *Attorney, Agent, or Firm*—Jeffrey T. Knapp

(57) ABSTRACT

A thermal module (10) includes a fin assembly (14), a heat pipe (16) thermally contacting with a heat generating electronic component (60) disposed on a printed circuit board (50) and the fin assembly, and a resilient fastener (20) attaching an evaporation section (164) of the heat pipe to the heat generating electronic component. The fastener includes a mounting element (40) being attached to the printed circuit board, and an engaging element (30) embedded in the mounting element. The engaging element includes a base plate (32) having a first surface contacting with the evaporation section of the heat pipe and a second surface thermally contacting with the heat generating electronic component, and at least a resilient strip (34) sandwiched between the first surface of the base plate of the engaging element and the mounting element.

17 Claims, 4 Drawing Sheets

US 7,855,889 B2

RESILIENT FASTENER AND THERMAL MODULE INCORPORATING THE SAME

BACKGROUND OF THE INVENTION

1. Field of the Invention

The present invention relates to fasteners, and more particularly to a fastener which can mount a thermal module onto a printed circuit board without risking damage to a heat generating electronic component disposed on the printed circuit board.

2. Description of Related Art

Thermal modules are traditionally used in micro-electronics to help transfer heat from heat generating electronic components mounted on a printed circuit board. The thermal module includes a heat sink, a heat pipe and a heat dissipating fan. The heat sink is located at an air outlet of the heat dissipating fan. The heat pipe has an evaporation section thermally contacting with the heat generating electronic component and a condensation section thermally contacting with the heat sink to transfer heat therebetween. The heat dissipating fan generates airflow which flows through the heat sink to take away heat therefrom.

In the thermal module, the evaporation section of the heat pipe is received in a groove of a casting die. The casting die is screwed to the printed circuit board to hold the evaporation section of the heat pipe in intimate contact with the heat generating electronic component. However, because the heat generating electronic component protrudes from a top surface of the printed circuit board, a space is formed between a bottom surface of the casting die and the top surface of the printed circuit board. In assembling of the casting die to the printed circuit board, it is difficult to control force exerted on the casting die and keep a proper space therebetween, so the evaporation section of the heat pipe can be held in intimate contact with but not damage the heat generating electronic component. However, excess force is always exerted on the casting die and this risks damaging the heat generating electronic component. Therefore, there is a need for providing a fastener which can make the evaporation section of the heat pipe to have an intimate contact with but not damage the heat generating electronic component.

SUMMARY OF THE INVENTION

The present invention relates, in one respect, to a resilient fastener. The resilient fastener includes a mounting element being attached to a printed circuit board with a heat generating electronic component disposed thereon; and an engaging element engaged with the mounting element. The engaging element includes a base plate thermally contacting with the heat generating electronic component, and at least a resilient strip sandwiched between the base plate of the engaging element and the mounting element to provide a resilient deformation which can be used to regulate force exerted on the heat generating electronic component thereby preventing the heat generating electronic from being damaged.

The present invention relates, in another respect, to a thermal module. The thermal module includes a fin assembly, a heat pipe for thermally contacting with a heat generating electronic component disposed on a printed circuit board and the fin assembly, and a resilient fastener for attaching an evaporation section of the heat pipe to the heat generating electronic component. The fastener includes a mounting element allowing it to be attached to the printed circuit board, and an engaging element embedded in the mounting element. The engaging element includes a base plate having a first surface contacting with the evaporation section of the heat pipe and a second surface thermally contacting with the heat generating electronic component, and at least a resilient strip sandwiched between the first surface of the base plate of the engaging element and the mounting element. The at least a resilient strip provides a resilient deformation which regulates force exerted downwards on the heat generating electronic component when the mounting element is screwed downwards to the printed circuit board.

Other advantages and novel features of the present invention will become more apparent from the following detailed description of preferred embodiments when taken in conjunction with the accompanying drawings, in which:

DETAILED DESCRIPTION OF THE INVENTION

Figure 1:
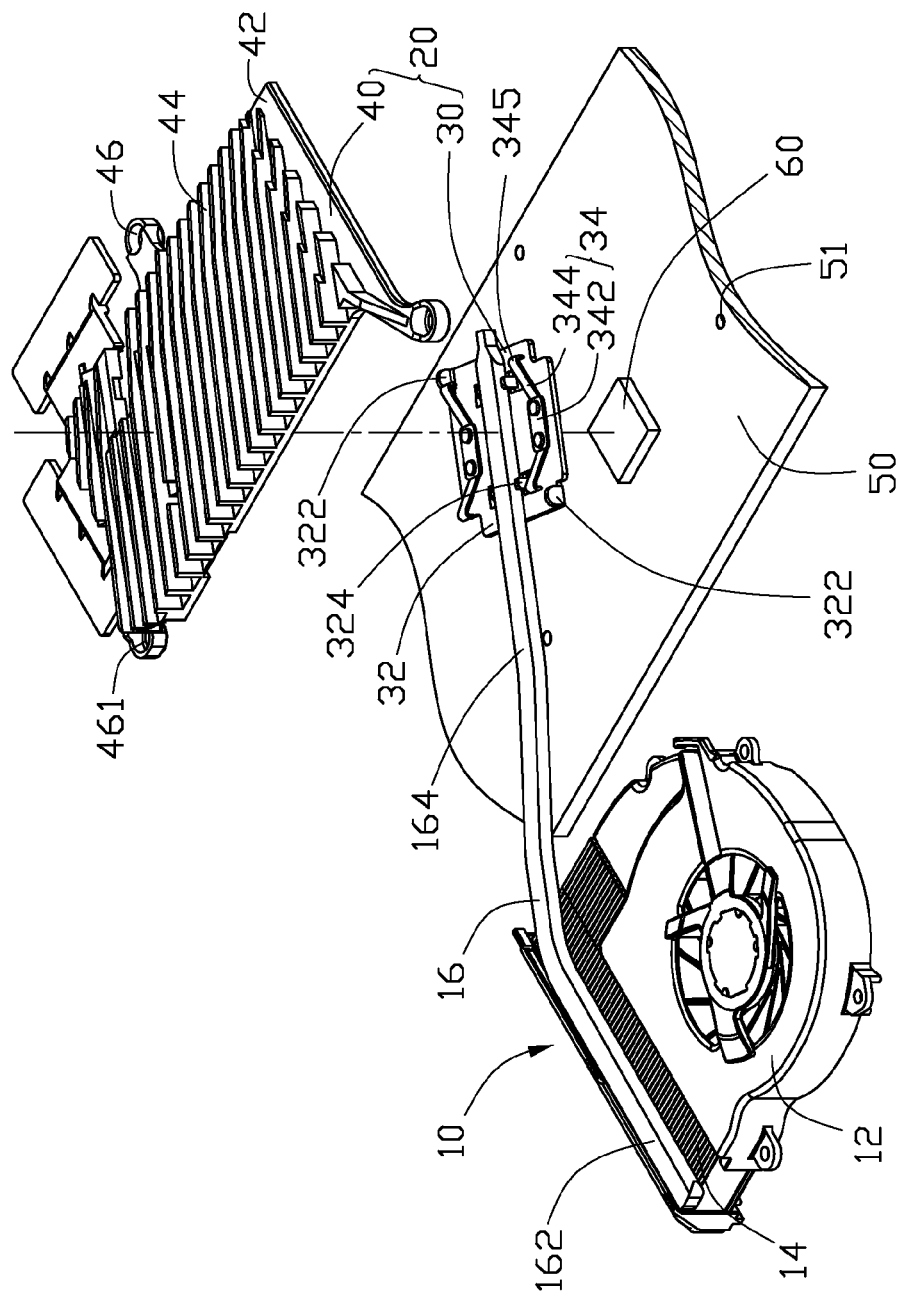
FIG. 1 is an exploded, isometric view of a printed circuit board with a heat generating electronic component disposed thereon and a thermal module in accordance with a preferred embodiment of the present invention.

Referring to FIG. 1, a printed circuit board 50 with a heat generating electronic component 60 disposed thereon and a thermal module 10 according to a preferred embodiment of the present invention are shown. The thermal module 10 is mounted on the printed circuit board 50 and thermally connects with the heat generating electronic component 60. The thermal module 10 includes a centrifugal blower 12, a fin assembly 14, a flatten heat pipe 16 and a fastener 20. The fin assembly 14 is mounted to an air outlet (not labeled) of the centrifugal blower 12. The centrifugal blower 12 provides an airflow through the fin assembly 14 to take away heat therefrom. The heat pipe 16 has an evaporation section 164 thermally connecting with the heat generating electronic component 60, and a condensation section 162 thermally connecting with a top surface of the fin assembly 14 to transfer heat therebetween. The fastener 20 attaches the evaporation section 164 of the heat pipe 16 to the heat generating electronic component 60 so as to absorb heat therefrom.

The fastener 20 includes a mounting element 40 and an engaging element 30 embedded in a bottom portion of the mounting element 40. The mounting element 40 includes a rectangular main plate 42 and a plurality of fins 44 extending upwardly from a top surface of the main plate 42. Three arms 46, each of which defines a through hole 461 therein, extend from three different sides of the main plate 42. The printed circuit board 50 defines three through holes 51 therein, corresponding to the through holes 461 of the arms 46 of the fastener 20.

The engaging element 30 includes a rectangular base plate 32 and two parallel resilient strips 34 disposed on the base plate 32. Two pairs of substantially L-shaped hooks 324 are punched upwardly from a middle portion of the base plate 32 with four holes (not labeled) being formed in the middle portion of the base plate 32. A channel (not labeled) is defined in a top surface of the base plate 32 between the hooks 324, for receiving the evaporation section 164 of the heat pipe 16 therein. The evaporation section 164 of the heat pipe 16 is caught by the hooks 324 of the engaging element 30 preventing it from becoming disengaged from the engaging element 30. The resilient strips 34 are aligned parallel to the evaporation section 164 of the heat pipe 16 and are arranged on lateral sides of the base plate 32, beside the hooks 324. Each of the resilient strips 34 includes a planar portion 342 and two wings 344 slantingly and upwardly extending from two opposite ends of the planar portion 342. The resilient strips 34 are fixed to the base plate 32 via screws or rivets extending through the planar portions 342 of the resilient strips 34 and engaged in the base plate 32. Free ends of the wings 344 of the resilient strips 34 are bent downwardly so as to form a smooth arc surface 345 at a bending portion of each of the free ends. Two catches 322 extend upwardly from two diagonally opposite corners of the base plate 32.

Figure 2:
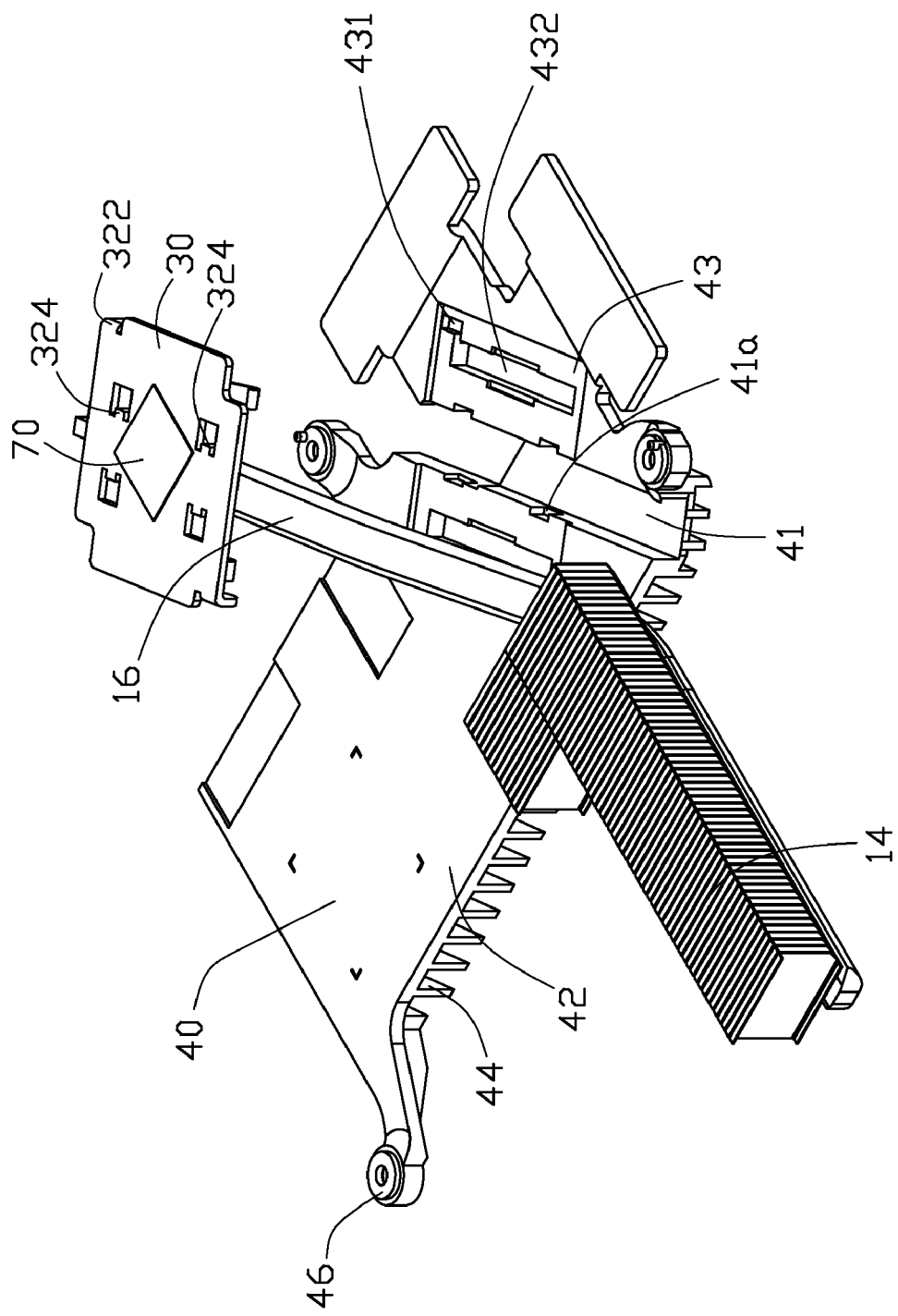
FIG. 2 is an exploded, isometric view of some of elements of the thermal module of FIG. 1, as viewed from a bottom aspect.

Referring to FIG. 2, a bottom portion of the main plate 42 of the mounting element 40 defines a slot 41 for receiving the evaporation section 164 of the heat pipe 16 therein. The bottom portion of the main plate 42 of the mounting element 40 further defines a rectangular cavity 43 traversing and communicating with the slot 41, for receiving the base plate 32 of the engaging element 30 therein. In addition, the bottom portion of the main plate 42 of the mounting element 40 defines two pairs of recesses 41a in sidewalls of the slot 41, for receiving the hooks 324 of the engaging element 30 therein. The bottom portion of the main plate 42 of the mounting element 40 defines two grooves 432 besides the slot 41 and in the rectangular cavity 43, for receiving the resilient strips 34 of the engaging element 30 therein. Finally, the bottom portion of the main plate 42 of the mounting element 40 defines two indents 431 in two diagonally opposite corners of the rectangular cavity 43, for receiving the catches 322 of the engaging element 30 therein.

Figure 3:
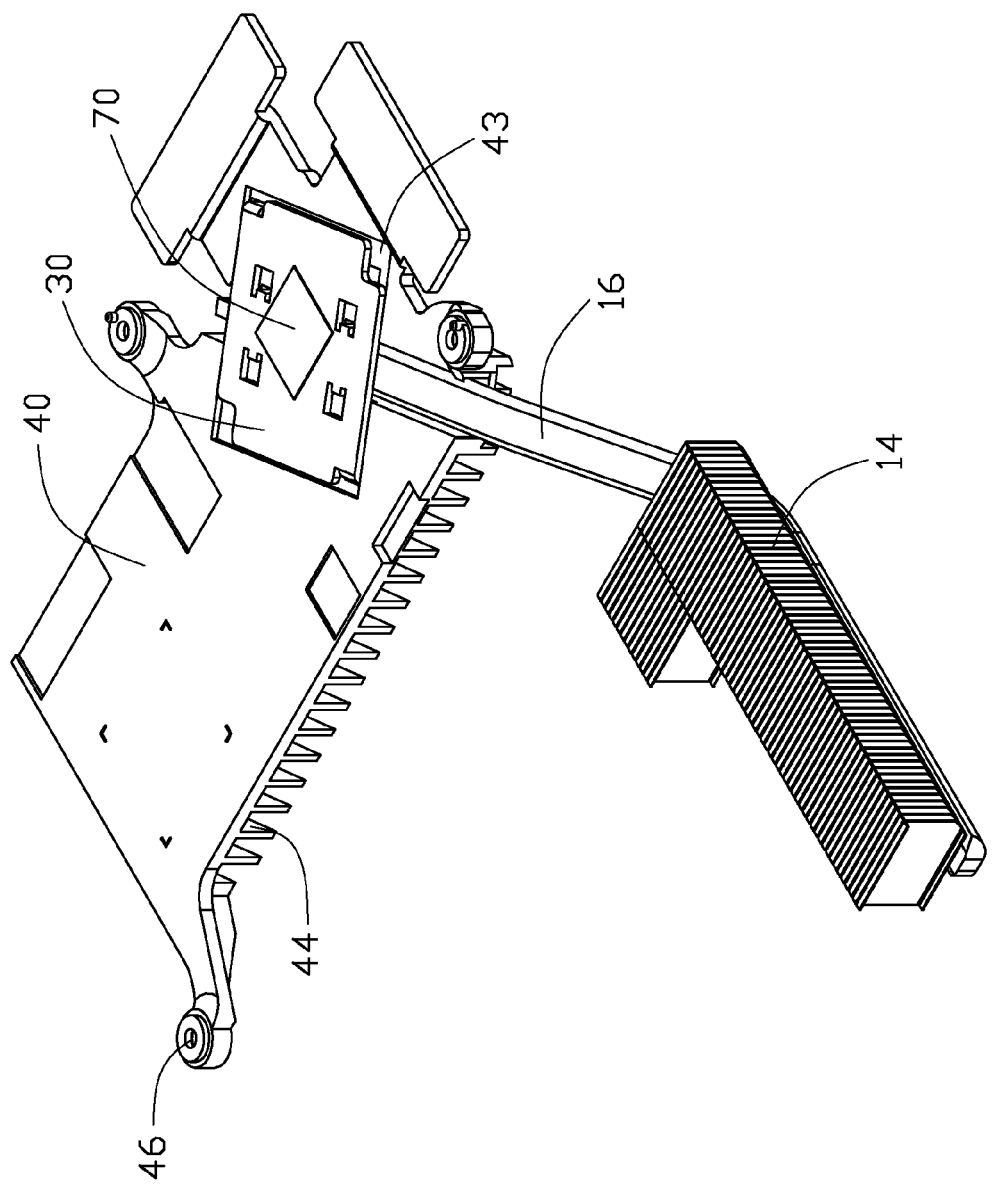
FIG. 3 is an assembled view of the elements of the thermal module of FIG. 2.
Figure 4:
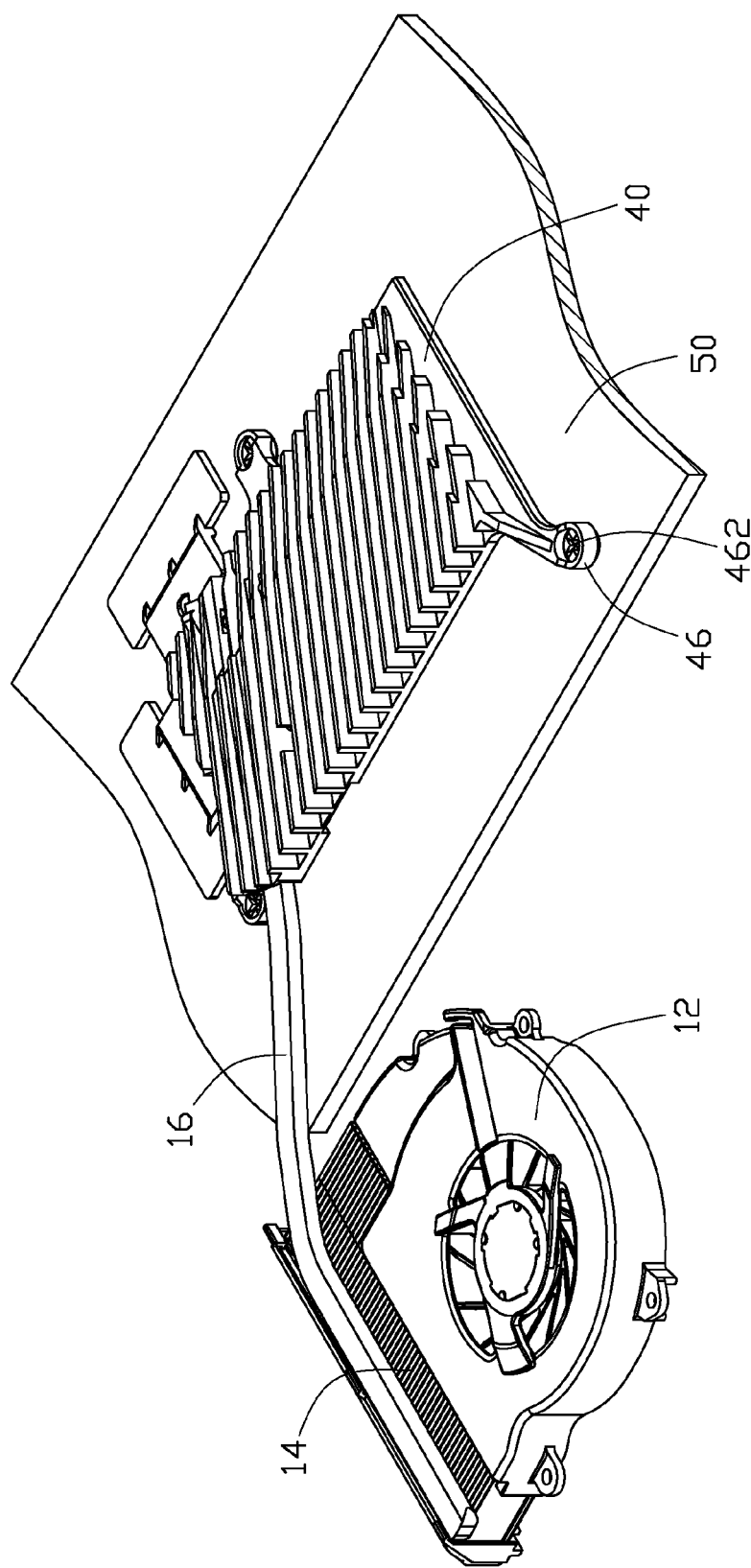
FIG. 4 is an assembled view of the thermal module and the printed circuit board of FIG. 1.

Referring to FIGS. 3 and 4, in assembly of the thermal module 10 to printed circuit board 50, the centrifugal blower 12, the fin assembly 14 and the heat pipe 16 are assembled together. The evaporation section 164 of the heat pipe 16 is received in the channel of the engaging element 30 and caught by the hooks 324. The engaging element 30 is received in the bottom portion of the mounting element 40 thereby obtaining the thermal module 10. Meanwhile, the base plate 32 of the engaging element 30 is received in the rectangular cavity 43 of the main plate 42 of the mounting element 40. The evaporation section 164 of the heat pipe 16 is received in the slot 41 of the main plate 42 of the mounting element 40. The hooks 324 are received in their respective recesses 41a of the main plate 42 of the mounting element 40. The resilient strips 34 are received in the grooves 432 of the main plate 42 with the arc surfaces 345 of the resilient strips 34 contacting with a bottom surface of the main plate 42 of the mounting element 40 defining the grooves 432. The catches 322 are received in the indents 431 of the main plate 42 of the mounting element 40. A layer of thermal interface material 70 is spread on a bottom surface of the base plate 32 of the engaging element 30 so as to improve heat transfer between the base plate 32 of the engaging element 30 of the thermal module 10 and the heat generating electronic component 60. Alternatively, thermal interface materials can also be spread between a top surface of the evaporation section 164 of the heat pipe 16 and the bottom surface of the main plate 42 of the mounting element 40, or/and a bottom surface of the evaporation section 164 of the heat pipe 16 and the top surface of the base plate 32 of the engaging element 30. The thermal module 10 is positioned on the printed circuit board 50 with the thermal interface material 70 on the bottom surface of the base plate 32 contacting with a top surface of the heat generating electronic component 60. Three fixing members 462 such as screws extend through the through holes 461, 51 of the fastener 20 and the printed circuit board 50 thereby mounting the thermal module 10 onto the printed circuit board 50.

In the assembly of the thermal module 10 to the printed circuit board 50, the resilient strips 34 are sandwiched between the top surface of the base plate 32 of the engaging element 30 and the bottom surface of the main plate 42 of the mounting element 40 defining the grooves 432. The resilient strips 34 provide a moderate deformation which regulates force exerted downwardly by the bottom surface of the base plate 32 on the top surface of the heat generating electronic component 60. The force helps to evenly spread the thermal interface material 70 between the bottom surface of the base plate 32 and the top surface of the heat generating electronic component 60 thus improving heat transfer therebetween and further increasing heat dissipation efficiency of the thermal module 10. The deformation also prevents excess force from being exerting on the heat generating electronic component 60 thus preventing the heat generating electronic component 60 from becoming damaged. In addition, the mounting element 40 of the fastener 20 includes a plurality of fins 44 extending from the main plate 42 thereof. The heat generated by the heat generating electronic component 60 can thus be dissipated towards a surrounding environment in two ways directions. One way is through the thermal interface material 70, the engaging element 30 of the fastener 20, the heat pipe 16 and the fin assembly 14. The other way is through the thermal interface material 70, the engaging element 30 of the fastener 20 and the mounting element 40 of the fastener 20. This further increases heat dissipation efficiency of the thermal module 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A resilient fastener comprising:
   a mounting element configured for being attached to a printed circuit board with a heat generating electronic component disposed thereon; and
   an engaging element engaged with the mounting element, and comprising a base plate configured for thermally contacting the heat generating electronic component, and at least a resilient strip sandwiched between the base plate of the engaging element and the mounting element, wherein the engaging element comprises at least a pair of hooks disposed on the base plate for receiving an evaporation section of a heat pipe therebetween.

2. The fastener as described in claim 1, wherein the at least a resilient strip of the engaging element is oriented parallel to a channel defined between the hooks, the channel being adapted for receiving the evaporation section of the heat pipe.

3. The fastener as described in claim 1, wherein the at least a resilient strip of the engaging element comprises a planar portion fixed to the base plate and two wings respectively and slantingly extending from two ends of the planar portion along a direction away from the base plate.

4. The fastener as described in claim 3, wherein a free end of each of the wings of the resilient strip is bent towards the base plate thereby forming a smooth arc surface at a bending portion thereof.

5. The fastener as described in claim 1, wherein the engaging element has a rectangular shaped configuration, two catches being respectively disposed at two diagonally opposite corners of the engaging element.

6. The fastener as described in claim 1, wherein the mounting element comprises a plurality of fins extending from a surface opposite to the engaging element.

7. A thermal module comprising:
a fin assembly;
a heat pipe having an evaporation section adapted for absorbing heat generated by a heat generating electronic component disposed on a printed circuit board and a condensation portion thermally engaging with the fin assembly; and
a resilient fastener for attaching the evaporation section of the heat pipe to the heat generating electronic component, the fastener comprising:
a mounting element configured for being attached to the printed circuit board; and
an engaging element embedded in the mounting element and comprising a base plate having a first surface contacting the evaporation section of the heat pipe and a second surface configured for thermally contacting the heat generating electronic component, and at least a resilient strip sandwiched between the first surface of the base plate of the engaging element and the mounting element.

8. The thermal module as described in claim 7, wherein the mounting element defines a slot for receiving the evaporation section of the heat pipe, and a cavity communicating with the slot and for receiving the base plate of the engaging element therein.

9. The thermal module as described in claim 7, wherein the engaging element comprises at least a pair of hooks disposed on the base plate for catching the evaporation section of the heat pipe on the engaging element, the mounting element defining at least a pair of recesses for receiving the hooks therein.

10. The thermal module as described in claim 7, wherein the at least a resilient strip of the engaging element comprises a planar portion fixed to the base plate and two wings respectively and slantingly extending from two ends of the planar portion along a direction away from the base plate, the mounting element defining a groove for receiving the at least a resilient strip of the engaging element therein.

11. The thermal module as described in claim 7, wherein the engaging element comprises two catches respectively disposed at two diagonally opposite corners thereof, the mounting element defining two indents for receiving the catches of the engaging element therein.

12. The thermal module as described in claim 7, wherein the mounting element comprises a plurality of fins extending from a surface opposite to the engaging element.

13. A thermal module comprising:
an engaging element having a bottom surface thermally engaging with a heat-generating electronic component and a top surface opposite the bottom surface;
a resilient element mounted on the top surface of the engaging element;
a mounting element secured to a printed circuit board on which the heat-generating electronic component is mounted, and exerting a downward force on the engaging element via the resilient element so that the bottom surface of the engaging element can make intimate contact with the heat-generating electronic component;
a heat pipe having an evaporating section thermally connecting with the engaging element, and a condensing section thermally connecting with a fin assembly; and
a fan for blowing airflow through the fin assembly.

14. The thermal module as described in claim 13, wherein the mounting element has fins extending upwardly.

15. The thermal module as described in claim 13, wherein the resilient element includes two resilient strips positioned at lateral sides of the evaporating section of the heat pipe, respectively.

16. The thermal module as described in claim 15, wherein each of the resilient strips includes a planar portion fixed to the engaging element and two wings respectively extending slantwise and upwardly from two ends of the planar portion to engage with the mounting element.

17. The thermal module as described in claim 16, wherein the mounting element has fins formed thereon.

\* \* \* \* \*